United States Patent
Wang et al.

(10) Patent No.: US 11,854,845 B2
(45) Date of Patent: Dec. 26, 2023

(54) SYSTEM FOR MONITORING ENVIRONMENT

(71) Applicant: CHANGXIN MEMORY TECHNOLOGIES, INC., Hefei (CN)

(72) Inventors: Xubao Wang, Hefei (CN); Yunxiao Ding, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 162 days.

(21) Appl. No.: 17/449,448

(22) Filed: Sep. 29, 2021

(65) Prior Publication Data
US 2022/0084851 A1 Mar. 17, 2022

Related U.S. Application Data

(63) Continuation of application No. PCT/CN2021/103861, filed on Jun. 30, 2021.

(30) Foreign Application Priority Data

Sep. 16, 2020 (CN) .......................... 202010973453.8

(51) Int. Cl.
*H01L 21/67* (2006.01)
*B01D 53/22* (2006.01)
(Continued)

(52) U.S. Cl.
CPC ........ *H01L 21/67253* (2013.01); *B01D 53/22* (2013.01); *G01N 1/2205* (2013.01); *G05B 19/4184* (2013.01); *G01N 1/2247* (2013.01)

(58) Field of Classification Search
CPC ........ H01L 21/67253; H01L 21/67389; B01D 53/22; G01N 1/2205; G01N 1/2247;
(Continued)

(56) References Cited

U.S. PATENT DOCUMENTS 6,167,107 A    12/2000   Bates
6,176,120 B1    1/2001   You
(Continued)

FOREIGN PATENT DOCUMENTS

CN        1218906 A    6/1999
CN    100573090 C    12/2009
(Continued)

OTHER PUBLICATIONS

International Search Report in the international application No. PCT/CN2021/103771, dated Sep. 8, 2021.
(Continued)

*Primary Examiner* — David Z Huang
(74) *Attorney, Agent, or Firm* — SYNCODA LLC; Feng Ma

(57) ABSTRACT

A system for monitoring an environment can be used for monitoring concentrations of airborne contaminants in a plurality of process areas in a clean room. The system includes: a sampling device, configured to collect environmental samples from process areas and including a system sampling pipeline, the environmental sample including air; an analysis device, connected to an output end of the system sampling pipeline; an air supply device, connected to the system sampling pipeline and configured to provide a purge gas to the system sampling pipeline; and a humidification device, configured to provide water mist and connected between the air supply device and the system sampling pipeline.

12 Claims, 4 Drawing Sheets

(51) Int. Cl.
*G05B 19/418* (2006.01)
*G01N 1/22* (2006.01)

(58) Field of Classification Search
CPC .... G01N 1/2273; G01N 1/26; G05B 19/4184; F24F 6/12; F24F 3/167; F24F 2110/20; F24F 6/00
See application file for complete search history.

(56) References Cited

U.S. PATENT DOCUMENTS

| | | | |
|---|---|---|---|
| 6,244,576 B1 * | 6/2001 | Tsai | F24F 6/02 261/DIG. 65 |
| 6,408,701 B1 | 6/2002 | Fujita | |
| 6,793,205 B2 * | 9/2004 | Eom | B05B 17/0615 261/142 |
| 7,377,982 B2 * | 5/2008 | Alvarez, Jr. | H01L 21/02046 134/21 |
| 7,973,668 B2 | 7/2011 | Calio | |
| 8,701,980 B2 | 4/2014 | Calio | |
| 8,939,011 B2 | 1/2015 | Li | |
| 9,046,453 B2 | 6/2015 | Calio et al. | |
| 9,448,144 B2 | 9/2016 | Calio, Jr. et al. | |
| 9,658,140 B2 | 5/2017 | Calio et al. | |
| 9,677,976 B2 | 6/2017 | Chrin, II | |
| 9,921,140 B2 | 3/2018 | Calio et al. | |
| 10,247,645 B2 | 4/2019 | Calio et al. | |
| 10,431,484 B2 | 10/2019 | Le-Barillec et al. | |
| 10,533,930 B2 | 1/2020 | Chrin | |
| 10,627,324 B2 | 4/2020 | Calio et al. | |
| 2004/0023419 A1 | 2/2004 | Kishkovich | |
| 2010/0283620 A1 * | 11/2010 | Calio | G01N 1/2273 73/864.34 |
| 2012/0152040 A1 | 6/2012 | Calio | |
| 2013/0105566 A1 | 5/2013 | Calio | |
| 2014/0165705 A1 | 6/2014 | Li | |
| 2014/0183256 A1 | 7/2014 | Calio et al. | |
| 2014/0318217 A1 | 10/2014 | Li | |
| 2015/0268138 A1 | 9/2015 | Calio et al. | |
| 2016/0238494 A1 * | 8/2016 | Chrin, II | G01N 1/2273 |
| 2016/0363514 A1 | 12/2016 | Calio, Jr. et al. | |
| 2017/0090486 A1 | 3/2017 | Chrin | |
| 2017/0254730 A1 | 9/2017 | Calio et al. | |
| 2018/0209876 A1 | 7/2018 | Calio et al. | |
| 2018/0247847 A1 | 8/2018 | Le-Barillec et al. | |
| 2019/0226948 A1 | 7/2019 | Calio et al. | |
| 2020/0150002 A1 | 5/2020 | Chrin | |
| 2022/0082476 A1 * | 3/2022 | Wang | G01N 1/2273 |

FOREIGN PATENT DOCUMENTS

| | | |
|---|---|---|
| CN | 102081017 A | 6/2011 |
| CN | 102375041 A | 3/2012 |
| CN | 103093166 A | 5/2013 |
| CN | 203490109 U | 3/2014 |
| CN | 203837974 U | 9/2014 |
| CN | 104515822 A | 4/2015 |
| CN | 204462111 U | 7/2015 |
| CN | 105043818 A | 11/2015 |
| CN | 105784557 A | 7/2016 |
| CN | 205608477 U | 9/2016 |
| CN | 106198119 A | 12/2016 |
| CN | 106247514 A | 12/2016 |
| CN | 106290688 A | 1/2017 |
| CN | 206208858 U | 5/2017 |
| CN | 107193056 A | 9/2017 |
| CN | 107741419 A | 2/2018 |
| CN | 108171954 A | 6/2018 |
| CN | 207430809 U | 6/2018 |
| CN | 108352345 A | 7/2018 |
| CN | 108731986 A | 11/2018 |
| CN | 108837639 A | 11/2018 |
| CN | 108966171 A | 12/2018 |
| CN | 208420839 U | 1/2019 |
| CN | 109470626 A | 3/2019 |
| CN | 109557007 A | 4/2019 |
| CN | 109952473 A | 6/2019 |
| CN | 110361466 A | 10/2019 |
| CN | 211262877 U | 8/2020 |
| EP | 1196832 A2 | 4/2002 |
| FR | 3081558 A1 | 11/2019 |
| JP | 2000321180 A | 11/2000 |
| JP | 2002156314 A | 5/2002 |
| TW | 200416930 A | 9/2004 |
| WO | 2009100184 A1 | 8/2009 |

OTHER PUBLICATIONS

International Search Report in the international application No. PCT/CN2021/105332, dated Sep. 30, 2021.

International Search Report in the international application No. PCT/CN2021/103861, dated Oct. 9, 2021.

First Office Action of the Chinese application No. 202010973453.8, dated Aug. 16, 2022.

* cited by examiner

SYSTEM FOR MONITORING ENVIRONMENT

CROSS-REFERENCE TO RELATED APPLICATIONS

This is a continuation of International Application No. PCT/CN2021/103861 filed on Jun. 30, 2021, which claims priority to Chinese Patent Application No. 202010973453.8 filed on Sep. 16, 2020. The disclosures of these applications are hereby incorporated by reference in their entirety.

BACKGROUND

With the increase in the complexity of the semiconductor industry process and the miniaturization of feature sizes of products, the impact of airborne contaminants on the products has become a key concern for environmental control of a clean room.

SUMMARY

Embodiments of this disclosure relate to the field of semiconductors, and in particular, to a system for monitoring an environment.

The embodiments of this disclosure provide a system for monitoring an environment, used for monitoring concentrations of airborne contaminants in a plurality of process areas in a clean room. The system for monitoring an environment includes a sampling device, an analysis device, an air supply device, and a humidification device. The sampling device is configured to collect environmental samples from process areas and includes a system sampling pipeline. The environmental samples include air. The analysis device is connected to an output end of the system sampling pipeline. The air supply device is connected to the system sampling pipeline and configured to provide a purge gas to the system sampling pipeline. The humidification device is configured to provide water mist and connected between the air supply device and the system sampling pipeline.

BRIEF DESCRIPTION OF THE DRAWINGS

One or more embodiments are exemplified by figures in the corresponding drawings. These exemplified descriptions do not constitute a limitation on the embodiments. Elements with the same reference numerals in the drawings are denoted as similar elements. Unless otherwise stated, the figures in the drawings do not constitute a scale limitation.

DETAILED DESCRIPTION

To make the objectives, technical solutions, and advantages of embodiments of this disclosure clearer, the embodiments of this disclosure are described below in detail with reference to the accompanying drawings. However, it should be understood for persons of ordinary skill in the art that, in each embodiment of this disclosure, many technical details are proposed for a reader to better understand this disclosure. However, the technical solutions claimed by this disclosure can be realized, even without these technical details and various changes and modifications based on the following embodiments.

Dry gas is used as a gas of the existing system for monitoring an environment for cleaning a sampling pipeline. However, some contaminants remaining in the sampling pipeline are difficult to be quickly removed by the dry gas, causing problems of longer cleaning time, longer cycle time for system sampling, and lower frequency for system sampling. Moreover, because some residual contaminants are difficult to be completely removed by the dry gas, it may also cause the problem that data about the airborne contaminant obtained through sampling analysis have low accuracy.

Figure 1:
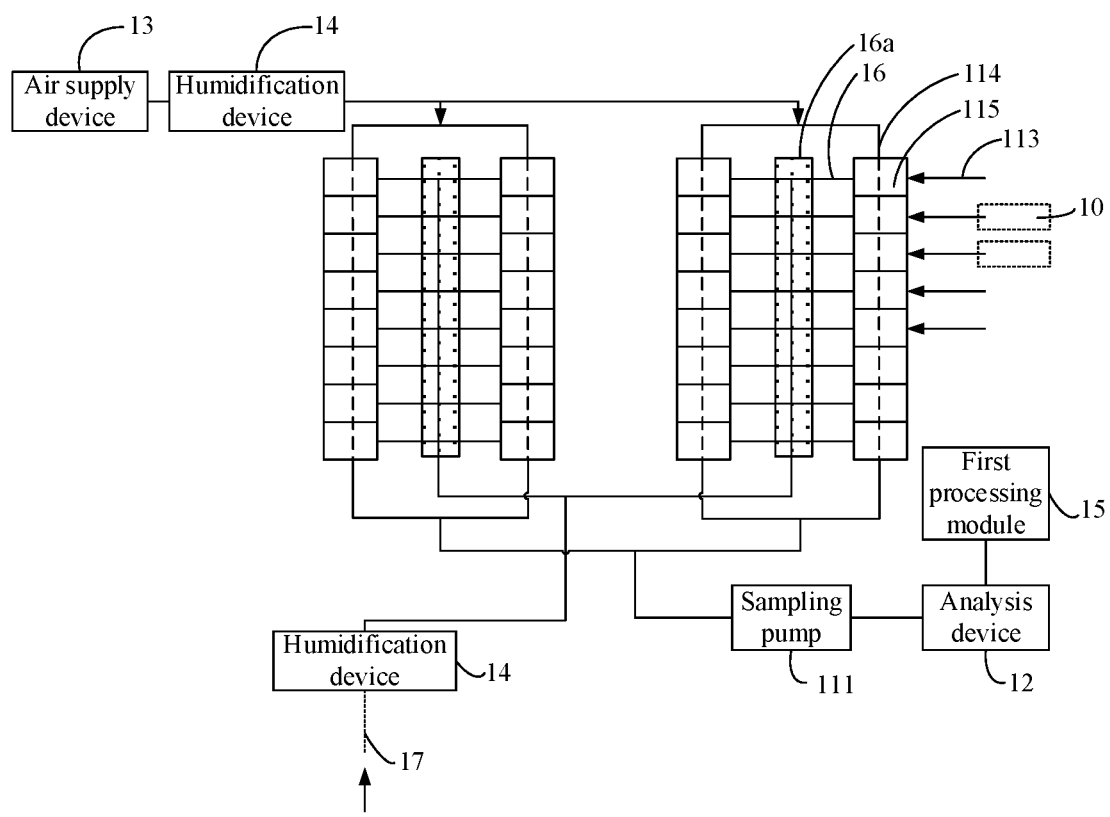
FIG. 1 schematically shows a structure of a system for monitoring an environment provided by an embodiment of this disclosure.

FIG. 1 schematically shows a structure of a system for monitoring an environment provided by an embodiment of this disclosure.

Referring to FIG. 1, a system for monitoring an environment is used for monitoring concentrations of airborne contaminants in a process area 10 in a clean room, includes a plurality of process areas 10 in the clean room, a sampling device (not shown), an analysis device 12, an air supply device 13, and a humidification device 14. The sampling device is configured to collect environmental samples of the process areas 10 and includes a system sampling pipeline 114. The environmental samples include air. The analysis device 12 is connected to an output end of the system sampling pipeline 114. The air supply device 13 is connected to the system sampling pipeline 114 and configured to provide a purge gas to the system sampling pipeline 114. The humidification device 14 is configured to provide water mist and connected between the air supply device 13 and the system sampling pipeline 114.

In this embodiment, the sampling device includes a sampling pump 111 connected to the process areas 10 and configured to extract the air from the process areas.

In another example, the sampling device further includes a buffer box (not shown). The buffer box is used for pre-mixing and stabilizing the environmental samples collected by the sampling pump 111, to ensure that the air pressure of the environmental samples for analysis is within a preset range, avoiding a pressure fluctuation caused by intermittent sampling of the sampling pump 111, preventing data analysis of the analysis device 12 from being affected by the pressure fluctuation, and ensuring the accuracy of concentration data of airborne contaminants obtained by the analysis device 12.

Data analysis can be performed by the analysis device 12 when the pressure in the buffer box is within the preset range. The buffer box may perform a pressure calculation function. In addition, the buffer box may have a pressure relief port, which is used to relieve part of the pressure when there is no time for data analysis due to the sudden increase in the internal pressure of the buffer box, to ensure that the data about concentration obtained by the analysis has higher accuracy.

In this embodiment, the sampling pump 111 may be in type of a diaphragm pump. A gas delivery pipeline is separated from a plunger through a diaphragm, so as to prevent contaminants on a surface of the plunger from contaminating the transported gas, thereby ensuring the accuracy of the data about the concentration obtained by the analysis device 12.

In one example, the analysis device 12 includes a plurality of analysis modules. Each of the analysis modules is configured to analyze the concentration of the corresponding airborne contaminant. The plurality of analysis modules can simultaneously analyze the environmental samples collected by the sampling device from a single sampling. In this way, concentrations of different types of airborne contaminants can be obtained at the same time without sequential analysis, which facilitates shortening the overall analysis time for the concentrations of airborne contaminants. In addition, the sampling frequency of the environmental samples can be reduced, and thus the monitoring time for the concentrations of airborne contaminant can be further shortened, thereby facilitating the rapid monitoring and rapid treatment for the concentrations of the airborne contaminants.

In another example, the analysis device 12 includes an acid analysis module, an ammonia analysis module, a sulfur analysis module, and an organic substance analysis module, which are respectively configured to monitor the concentration of an acidic gas, the concentration of an ammonia, the concentration of a sulfur dioxide, and the concentration of an organic substance in the process areas 10, to prevent the acidic gas and ammonia from affecting the formation of metal wires, prevent salts produced by the reaction of the acidic gas and ammonia from affecting the product yield, and prevent sulfur dioxide from combining with ammonia to cause atomization on a surface of a photomask, thereby avoiding the reduction in the product yield and the increase in rework rate caused by the atomization.

In other embodiments, the analysis device may further include an analysis module for other airborne contaminants. It should be noted that any gas that may affect the process or product yield can be regarded as an airborne contaminant, and the types of airborne contaminants may be different in different process areas. In this embodiment, the sampling device further includes a plurality of single sampling pipelines 113. Each of the process areas 10 is connected to one of the single sampling pipelines 113. The single sampling pipelines 113 connected to different process areas 10 are different. The system sampling pipeline 114 can be connected to anyone of the single sampling pipelines 113. An output end of the system sampling pipeline 114 is connected to the analysis device 12. The sampling device further includes a sampling valve 115, configured to connect or disconnect the single sampling pipelines 113 and the system sampling pipeline 114.

Figure 2:
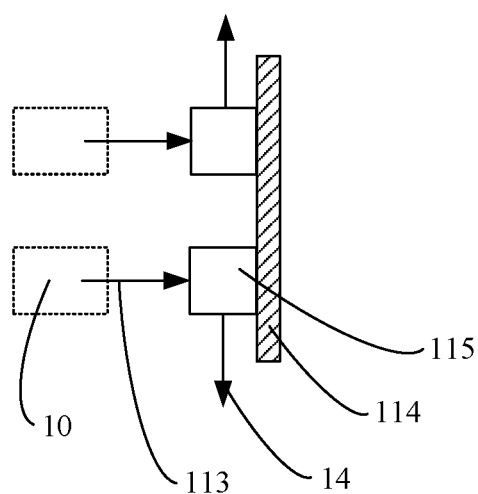
FIG. 2 is a first schematic diagram illustrating localized structures of a system for monitoring an environment provided by an embodiment of this disclosure.

Referring to FIG. 2, a positional relationship among the single sampling pipelines 113, the system sampling pipeline 114, and the sampling valve 115 is shown. The system sampling pipeline 114 is a continuous channel. On an extension path of the system sampling pipeline 114, the system sampling pipeline 114 may be connected to each of the single sampling pipelines 113 through the sampling valve 115. When the connection of the single sampling pipelines 113 and the system sampling pipeline 114 is disconnected by the sampling valve 115, the gas in the process areas 10 can only enter the single sampling pipelines 113, and cannot reach the system sampling pipeline 114. When the sampling valve 115 connects the single sampling pipelines 113 and the system sampling pipeline 114, the gas in the process areas 10 can reach the system sampling pipeline 114 through the single sampling pipelines 113.

It should be noted that at a same moment, one or more sampling valves 115 may be in a state of connecting the single sampling pipelines 113 and the system sampling pipeline 114. That is, the analysis device 12 can be configured to analyze the concentration of the airborne contaminant in one process area 10, and can also be configured to analyze an average concentration of the airborne contaminants in the plurality of process areas 10.

The plurality of sampling valves 115 are fixed on a valve disc 16a.

Since the system sampling pipeline 114 is shared, in order to avoid residual airborne contaminants in the previous sampling process from affecting a next sampling, it is necessary to clean the system sampling pipeline 114 between two collections. The sampling valve 115 can be disposed at one end of the single sampling pipeline 113 towards the system sampling pipeline 114, in order to avoid being unable to be effectively removed due to the accumulation of airborne contaminants in the single sampling pipeline 113 during the cleaning process. In this way, it is ensured that the single sampling pipeline 113 has a higher cleanliness, and the sampling valve 115 can be cleaned to a certain extent.

In this embodiment, the system for monitoring an environment further includes a control device (not shown), configured to control the sampling device to collect environmental samples from preset process areas 10. The control device is further configured to control a valve state of the sampling valve 115. That is, the switching of objects collected from the process areas 10 is realized, by controlling a valve state of the sampling valve 115 through the control device, so as to obtain the data about the concentrations of airborne contaminants of the specific process areas 10.

In this embodiment, the control device is further configured to set a concentration threshold for at least one process area 10. The system for monitoring an environment further includes a warning device (not shown), configured to send, responsive to a concentration threshold of any process area 10 exceeding the preset concentration threshold of the process area 10, warning information. In this way, it is beneficial to quickly clean the specific process areas where airborne contaminants exceed the standard.

In this embodiment, the air supply device 13 is connected to the system sampling pipeline 114. The air supply device 13 is configured to provide a purge gas, purge the system sampling pipeline 114 using the purge gas, and send the purged gas to the analysis device 12. In this way, when the environment of the system sampling pipeline 114 is confirmed to satisfy the sampling requirements by the analysis device 12, the air supply device 13 is controlled by the control device to stop purging, and thus the next sampling is performed. In this way, it is ensured that the environment of the system sampling pipeline 114 during the next sampling satisfies the preset requirements, so as to prevent the environment of the system sampling pipeline 114 from interfering the analysis of the airborne contaminant concentration in the process area 10, and to ensure the accuracy of detection results.

It should be noted that the purging to the system sampling pipeline 114 by the air supply device 13 may also affect the adsorption of an inner wall of the system sampling pipeline 114. Specifically, the longer the purging time is, the cleaner the inner wall of the system sampling pipeline 114 is, the greater the adsorption capacity of the inner wall to the airborne contaminants is, and the lower the detection value of airborne contaminants is. Accordingly, the shorter the purging time is, the dirtier the inner wall of the system sampling pipeline 114 is. The airborne contaminants on the inner wall of the system sampling pipeline 114 may affect the detection results, resulting in the higher detection value of airborne contaminants. That is, when cleaning the system sampling pipeline 114, the cleaning time needs to be controlled, so that the inner wall of the system sampling pipeline 114 is at a preset clean level.

In this embodiment, the humidification device 14 is configured to provide water mist. The humidification device 14 is connected between the air supply device 13 and the system sampling pipeline 114, so that the purge gas enters the system sampling pipeline 114 through the humidification device 14. In this way, after the purge gas provided by the air supply device 13 is humidified by the water mist provided by the humidification device 14, the purge gas contains the water mist. Because some residual contaminants in the system sampling pipeline 114 are soluble in water, the residual contaminants in the system sampling pipeline 114 can be removed quickly. Therefore, the cleaning time is shortened, increasing the sampling frequency. Moreover, after one sampling and prior to next sampling, the residual contaminants in the system sampling pipeline 114 can be more thoroughly removed by the humidification device 14, to ensure that each sampling would not be interfered by the airborne contaminants in the process area from the sampling prior to it, which facilitates ensuring that the data about the airborne contaminants in the process area obtained from each sampling analysis have higher accuracy.

Specifically, the residual contaminants in the pipelines may be ammonia.

Figure 3:
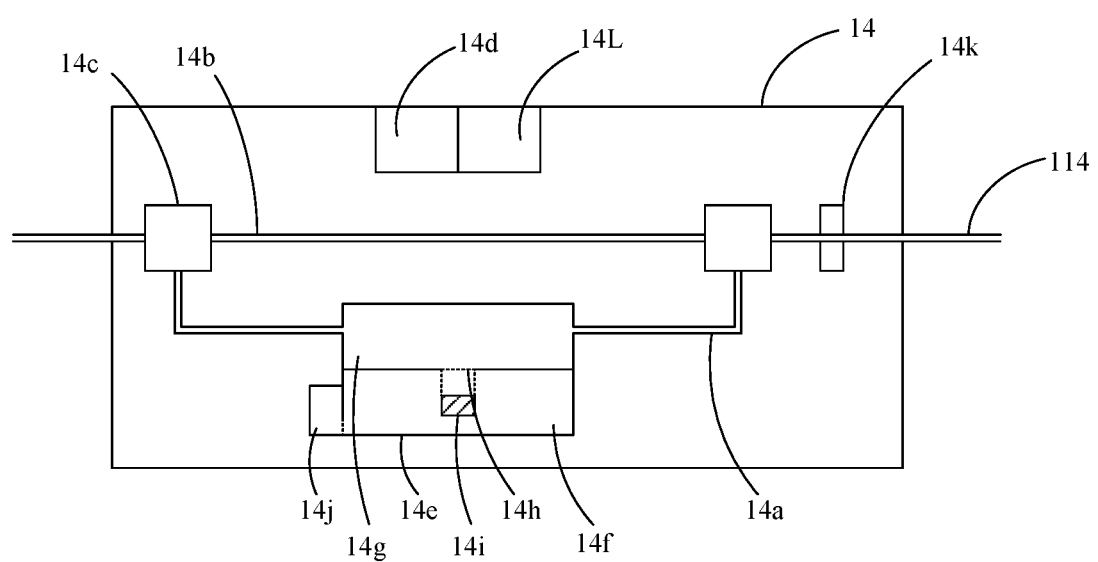
FIG. 3 is a second schematic diagram illustrating localized structures of a system for monitoring an environment provided by an embodiment of this disclosure.

Referring to FIG. 3, in this embodiment, the humidification device 14 includes a humidification pipeline 14a, a water storage tank 14e, and an oscillator 14i. The humidification pipeline 14a is connected between the system sampling pipeline 114 and the air supply device 13. The water storage tank 14e includes a water storage area 14f and a gas circulation area 14g connected to the water storage area 14f. The humidification pipeline 14a is connected to the gas circulation area 14g. The oscillator 14i is located in the water storage area 14f and configured to oscillate water in the water storage area 14f to generate water mist.

In one example, the humidification device 14 further includes a drying pipeline 14b and a valve 14c. The drying pipeline 14b is independent of the humidification pipeline 14a, and is connected between the air supply device 13 and the system sampling pipeline 114. The valve 14c is configured to switch one of the humidification pipeline 14a and the drying pipeline 14b to be connected to the system sampling pipeline 114, and the other one of the humidification pipeline 14a and the drying pipeline 14b to be disconnected from the system sampling pipeline 114. In this way, the humidification device 14 can be reasonably adjusted to adopt different pipelines according to different situations. For example, when the system sampling pipeline 114 contains residual airborne contaminants that are soluble in water, the humidification pipeline 14a is adopted. When the system sampling pipeline 114 does not contain residual airborne contaminants that are soluble in water, the drying pipeline 14b is adopted.

The valve 14c may be a solenoid valve.

In another example, the humidification device 14 further includes a timing module 14d. The timing module 14d is configured to set the time period for the connection between the humidification pipeline 14a and the system sampling pipeline 114. The timing module 14d is further configured to set the time period for the connection between the drying pipeline 14b and the system sampling pipeline 114.

Referring to FIG. 1, in this embodiment, the system for monitoring an environment further includes a first processing module 15, configured to control, based on analysis results of the analysis device 12, the valve 14c to switch one of the drying pipeline 14b and the humidification pipeline 14a to be connected to the system sampling pipeline 114, and the other one of the drying pipeline 14b and the humidification pipeline 14a to be disconnected from the system sampling pipeline 114. When the air supply device 13 purges the gas in the system sampling pipeline 114 to the analysis device 12 through the drying pipeline 14b of the humidification device 14, and the analysis device 12 analyzes that the gas contains airborne contaminants that are more soluble in water, the valve 14c is controlled by the first processing module 15 to switch the drying pipeline 14b to the humidification pipeline 14a, so as to continue purging the system sampling pipeline 114. In this way, when the system sampling pipeline 114, upon the analyzing of the analysis device 12, contains airborne contaminants that are more soluble in water, the drying pipeline 14b of the humidification device 14 is switched to the humidification pipeline 14a, so as to quickly remove the airborne contaminants in the system sampling pipeline 114 and shorten the cleaning time, thereby increasing the sampling frequency.

In summary, the humidification device 14 being connected to the system sampling pipeline 114 using the humidification pipeline 14a or the drying pipeline 14b can be switched by the timing module 14d or the first processing module 15.

Referring to FIG. 3, in this embodiment, the water storage tank 14e further includes a mesh structure 14h, a water injection port (not shown), and a liquid level detection sensor (not shown). The water storage area 14f is connected to the gas circulation area 14g through the mesh structure 14h. The mesh structure 14h may be a metal mesh. The water injection port connects the water storage area 14f to an external water supply pipeline. When the liquid level detection sensor detects that a water level of the water storage tank 14e is lower than a warning water level, the external water supply pipeline injects water into the water storage tank 14e through the water injection port.

In this embodiment, the humidification device 14 further includes a circulating pump 14j connected to the water storage tank 14e and configured to maintain the continuous flow of water in the water storage tank 14e and prevent bacteria breeding.

In this embodiment, the system for monitoring an environment further includes a humidity sensor and a second processing module. The humidity sensor is disposed at a port of the system sampling pipeline 114 facing the humidification device 14 and configured to detect a humidity of the purge gas in the system sampling humidification 114. The second processing module displays, according to a humidity displayed by the humidity sensor, an amount of water mist provided by the humidification device 14.

Referring to FIG. 3, in one example, the humidity sensor 14k and the second processing module 14L may be disposed in the humidification device 14. The humidity sensor 14k is disposed at a port of a pipeline of the humidification device 14 facing the system sampling pipeline 114.

Referring to FIG. 1, in this embodiment, the system for monitoring an environment further includes a cleaning pipeline 16. A first end of the cleaning pipeline 16 is configured to introduce a clean dry air (CDA) and a second end of the cleaning pipeline 16 is connected to the single sampling pipeline 113. The sampling valve 15 is configured to control the single sampling pipeline 113 to connect to the system sampling pipeline 114 or the cleaning pipeline 16.

Specifically, referring to FIG. 2, when the single sampling pipeline 113 is connected to the cleaning pipeline 16, the sampling valve 115 is used for disconnecting the single sampling pipeline 113 and the system sampling pipeline 114, so that the gas in the system sampling pipeline 114 cannot enter the single sampling pipeline 113 or the corresponding process area 10. In this case, the single sampling pipeline 113 can be cleaned through the cleaning pipeline 16. In this way, it can be ensured that the single sampling pipeline 113 has a higher cleanliness, thereby preventing the airborne contaminants in the single sampling pipeline 113 from causing interference to an analysis result of the airborne contaminant concentration in the process areas 10.

In this embodiment, the system for monitoring an environment further includes an air inlet pipeline 17. One end of the air inlet pipeline 17 is connected to the first end of the cleaning pipeline 16, and the other end of the air inlet pipeline 17 is configured to introduce the clean dry air. The humidification device 14 is further connected between the air inlet pipeline 17 and the cleaning pipeline 16. In this way, the air inlet pipeline 17 contains water mist humidified clean dry air, which can clean the single sampling pipeline 113 through the cleaning pipeline 16. Because some residual contaminants in the single sampling pipeline 113 are soluble in water, the residual contaminants in the single sampling pipeline 113 can be removed quickly, thereby shortening the cleaning time, and increasing the sampling frequency.

In the sampling process of a process area 10, because the system sampling pipeline 114 is in contact with each sampling valve 115, airborne contaminants may be deposited on the surface of each sampling valve 115 exposed by the system sampling pipeline 114. At the same time, since molecules of the airborne contaminants are small and prone to drift, a small amount of airborne contaminants may be transferred to other positions of the sampling valve. Before performing the sampling in this process area 10 again, it is necessary to purge the system sampling pipeline 114 using the air supply device 13, to remove the airborne contaminants left in the system sampling pipeline 114 when the previous process area 10 is sampled, avoiding the airborne contaminants in the system sampling pipeline 114 from affecting the analysis results of the analysis device 12. In addition, since a small amount of airborne contaminants cannot be removed by purging through the air supply device 13, the clean dry air can be introduced for back-blowing, so as to perform further cleaning on the single sampling valve 113 corresponding to the process area 10 sampled for the second time. Since there are fewer residual airborne contaminants, the back-blowing has less influence on the analysis results.

It should be noted that, since the gas used by the air supply device 13 for purging is finally introduced to the buffer box, inert gas or nitrogen can be used for purging. In addition, since the gas during the back-blowing is finally introduced to the process area 10 of the clean room, and there may be a staff in the clean room, breathable dry air can be used, thereby ensuring the life safety of the staff.

Figure 4:
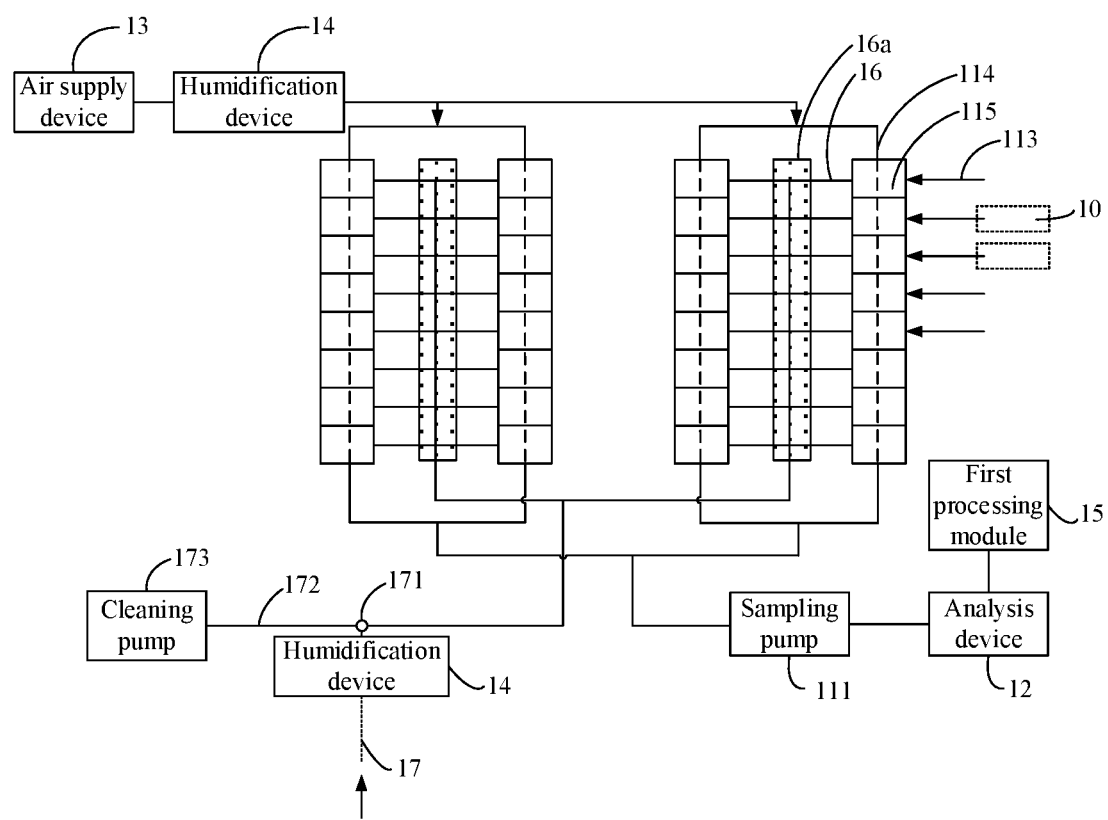
FIG. 4 schematically shows another structure of a system for monitoring an environment provided by an embodiment of this disclosure.

Referring to FIG. 4, in another example, the system for monitoring an environment further includes a gas exchange valve 171, an air outlet pipeline 172, and a cleaning pump 173. The gas exchange valve 171 is configured to control one end of the cleaning pipeline 16 to connect to one end of the air inlet pipeline 17. The other end of the air outlet pipeline 172 is configured to introduce the clean dry air. Alternatively, the gas exchange valve 171 is configured to control one end of the cleaning pipeline 16 to connect to one end of the air outlet pipeline 172. The other end of the air outlet pipeline 172 is connected to the cleaning pump 173. The cleaning pump 173 is configured to pump air.

When a process area 10 is sampled, single sampling pipelines 113 corresponding to other process areas 10 can be connected to the cleaning pipeline 16, and one end of the cleaning pipeline 16 is connected to the air outlet pipeline 172. A gas in the single sampling pipeline 113 is the same as an ambient gas in the corresponding process area 10 through pumping by the cleaning pump 173, facilitating the next sampling. The gas in the single sampling pipeline 113 is kept in a flow state through pumping by the cleaning pump 173, avoiding the airborne contaminants in the single sampling pipeline 113 from being adsorbed on the inner wall of the single sampling pipeline 113 due to the gas in a static state, and ensuring that the single sampling pipeline 113 has a higher degree of cleanliness, which is beneficial to improve the accuracy of the detection result.

Compared with back-blowing cleaning, air-pumping cleaning may proportionally or non-proportionally remove different airborne contaminants in the process areas 10, which causes an inaccurate detection result. Specifically, when the ratio of the removed airborne contaminants to the total airborne contaminants is different from the ratio of the removed carrier gas (gas other than the airborne contaminants) to the total carrier gas, the concentration of airborne contaminants in the process area 10 may be increased or reduced. When the ratio of different types of removed airborne contaminants to the total amount of airborne contaminants is different, the contrast relationship of the concentration of different types of airborne contaminants in the process area 10 may change.

Since the total amount of the clean dry air introduced during back-blowing can be calculated, the back-blowing cleaning solution can eliminate the influence of the clean dry air on the analysis of airborne contaminant concentration through calculation, thereby accurately obtaining the analysis results of airborne contaminants. The analysis results include the types of airborne contaminants, the concentrations of airborne contaminants, and the concentration ratio of different airborne contaminants.

In this embodiment, the humidification device is added between the air supply device and the system sampling pipeline, as well we between the air inlet pipeline and the cleaning pipeline to provide water mist. Some residual contaminants in pipelines can be then removed quickly due to the water-soluble properties thereof. Therefore, the cleaning time can be shortened, and the frequency for the sampling can be increased. After one sampling and prior to next sampling, the residual contaminants in the system sampling pipeline can be more thoroughly removed by the humidification device, to ensure that each sampling would not be interfered by the airborne contaminants in the process area from the sampling prior to it, which facilitates ensuring that the data about the airborne contaminants in the process area obtained from each sampling analysis have higher accuracy.

Persons of ordinary skill in the art can understand that the foregoing embodiments are exemplary embodiments for realizing this application. In practical applications, various changes can be made in form and details, without departing from the spirit and the scope of the embodiments of this application. Any person skilled in the art can make various changes and modifications without departing from the spirit and the scope of this application. Therefore, the protection scope of this application should be subject to the scope defined by the claims.

In the embodiments of this application, the system for monitoring the environment includes: a sampling device, an analysis device, an air supply device, and a humidification device. The sampling device is configured to collect environmental samples from the process areas and includes a system sampling pipeline. The environmental sample includes air. The analysis device is connected to an output end of the system sampling pipeline. The air supply device is connected to the system sampling pipeline and configured to provide a purge gas to the system sampling pipeline. The humidification device is configured to provide water mist and connected between the air supply device and the system sampling pipeline. In this way, water mist is provided by arranging the humidification device between the air supply device and the system sampling pipeline. Some residual contaminants in pipelines can be then removed quickly due to the water-soluble properties thereof. Therefore, the cleaning time can be shortened, and the frequency for the sampling can be increased. After one sampling and prior to next sampling, the residual contaminants in the system sampling pipeline can be more thoroughly removed by the humidification device, to ensure that each sampling would not be interfered by the airborne contaminants in the process area from the sampling prior to it, which facilitates ensuring that the data about the airborne contaminants in the process area obtained from each sampling analysis have higher accuracy.

What is claimed is:

1. A system for monitoring an environment, used for monitoring concentrations of airborne contaminants in a plurality of process areas in a clean room, comprising:
a sampling device, configured to collect environmental samples from process areas and comprising a system sampling pipeline, the environmental samples comprising air;
an analysis device, connected to an output end of the system sampling pipeline;
an air supply device, connected to the system sampling pipeline and configured to provide a purge gas to the system sampling pipeline; and
a humidification device, configured to provide water mist and connected between the air supply device and the system sampling pipeline;
wherein the humidification device comprises:
a humidification pipeline, connected between the system sampling pipeline and the air supply device;
a drying pipeline, independent of the humidification pipeline and connected between the air supply device and the system sampling pipeline; and
a valve, configured to select one of the humidification pipeline and the drying pipeline to be connected to the system sampling pipeline, and another one of the humidification pipeline and the drying pipeline to be disconnected from the system sampling pipeline,
wherein:
when there are residual airborne contaminants that are soluble in water in the system sampling pipeline, the humidification pipeline is selected, and
when there are no residual airborne contaminants that are soluble in water in the system sampling pipeline, the drying pipeline is selected.

2. The system for monitoring the environment of claim 1, wherein the humidification device further comprises:
a water storage tank, comprising a water storage area and a gas circulation area connected to the water storage area, the humidification pipeline being connected to the gas circulation area; and
an oscillator, located in the water storage area.

3. The system for monitoring the environment of claim 2, wherein the water storage tank further comprises a mesh structure and the water storage area is connected to the gas circulation area through the mesh structure.

4. The system for monitoring the environment of claim 2, wherein the water storage tank further comprises a water injection port, configured to connect the water storage area to an external water supply pipeline.

5. The system for monitoring the environment of claim 2, wherein the humidification device further comprises a circulating pump, connected to the water storage tank.

6. The system for monitoring the environment of claim 1, wherein the system further comprises a first processing module, configured to control, based on an analysis result of the analysis device, the valve to select one of the drying pipeline and the humidification pipeline to be connected to the system sampling pipeline, and other one of the drying pipeline and the humidification pipeline to be disconnected from the system sampling pipeline.

7. The system for monitoring the environment of claim 1, wherein the humidification device further comprises a timing module, configured to set a time period for connection between the humidification pipeline and the system sampling pipeline, and set a time period for connection between the drying pipeline and the system sampling pipeline.

8. The system for monitoring the environment of claim 1, wherein the system further comprises a humidity sensor, disposed at a port of the system sampling pipeline facing the humidification device and configured to detect a humidity of the purge gas of the system sampling pipeline.

9. The system for monitoring the environment of claim 8, wherein the system further comprises a second processing module, configured to adjust, according to the humidity, an amount of the water mist provided by the humidification device.

10. The system for monitoring the environment of claim 1, wherein the sampling device further comprises a plurality of single sampling pipelines; each of the process areas is connected to one of the single sampling pipelines, and the single sampling pipelines connected to different process areas are different;
the sampling device further comprises a sampling valve, configured to connect or disconnect the single sampling pipelines and the system sampling pipeline.

11. The system for monitoring the environment of claim 10, wherein the system further comprises
a cleaning pipeline, having a first end configured to introduce a clean dry air and a second end connected to the single sampling pipeline, the sampling valve being configured to control the single sampling pipeline to connect to the system sampling pipeline or the cleaning pipeline; and
an air inlet pipeline, having one end connected to the first end of the cleaning pipeline and other end configured to introduce the clean dry air;
the humidification device being further connected between the air inlet pipeline and the cleaning pipeline.

12. The system for monitoring the environment of claim 1, wherein the sampling device comprises a sampling pump, connected to the process areas and configured to extract the air from the process areas.

* * * * *